US005877510A

United States Patent [19]

Baba et al.

[11] Patent Number: 5,877,510

[45] Date of Patent: Mar. 2, 1999

[54] SPIN POLARIZED ELECTRON SEMICONDUCTOR SOURCE AND APPARATUS UTILIZING THE SAME

[75] Inventors: Toshio Baba; Masashi Mizuta, both of Tokyo; Tsunehiko Omori; Yoshimasa Kurihara, both of Ibaraki; Tsutomu Nakanishi, Aichi, all of Japan

[73] Assignee: NEC Corporation, Japan

[21] Appl. No.: 807,216

[22] Filed: Feb. 28, 1997

Related U.S. Application Data

[63] Continuation of Ser. No. 452,884, May 30, 1995, abandoned.

[30] Foreign Application Priority Data

May 27, 1994 [JP] Japan .................................... 115221

[51] Int. Cl.[6] ...................... H01L 29/06; H01L 31/0328; H01L 31/0336; H01L 31/072

[52] U.S. Cl. ................................ 257/21; 257/11; 257/18

[58] Field of Search ................................ 257/11, 18, 21

[56] References Cited

U.S. PATENT DOCUMENTS 3,968,376 7/1976 Pierce et al. ............................ 250/493
5,404,026 4/1995 Mariella, Jr. et al. .

FOREIGN PATENT DOCUMENTS 0512429 11/1992 European Pat. Off. .
0589475 3/1994 European Pat. Off. .
4069600 3/1992 Japan .
4329235 11/1992 Japan .
6076733 3/1994 Japan .
6163400 6/1994 Japan .
6223708 8/1994 Japan .

OTHER PUBLICATIONS

Geurley et al, "Diffusion dynamics of holes in . . . strained–layer super lattices", *Appl Phys Lttr*, 49(2), 14 Jul. 1986.

Schaff et al; "Strained–Layer Superlattices: Materials Science and Technology, Semiconductors and Semimetals" vol. 33; 1991; pp. 74–79; Academic Press.

Maruyama et al; "Physical Review Letters"; May 6, 1991; vol. 66, No. 18; pp. 2376–2379; The American Physical Society.

Nakanishi et al; "Physics Letters A"; Jan. 1991, vol. 158; pp. 345–349; Elseview Science Publishers B.V.

Omori et al; "Physical Review Letters"; Dec. 2, 1991, vol. 67, No. 23; pp. 3294–3297; The American Physical Society.

Lampel, G. et al; "Proposal For An Efficient Source of Polarized . . . " Solid State Communications, vol. 16, pp. 877–880, 1975.

Omori, T. et al; "Large Enhancement of Polarization Observed By . . . " Physical Review Letters, vol. 67, pp. 3294–3297, Dec. 2, 1991.

Nakanishi, T. et al; "Large Enhancement of Spin Polarization Observed by Photoelectrons From a Strained GaAs Layer" Physical Letters A, vol. 158, pp. 345–349, 1991.

*Primary Examiner*—Stephen D. Meier
*Attorney, Agent, or Firm*—Hayes, Soloway, Hennessey, Grossman & Hage, P.C.

[57] ABSTRACT

There are provided on a substrate a block layer having an electron affinity smaller than that of the substrate, a p-type strained superlattice structure having no lattice relaxation and operating as a generation region of spin polarized electrons and a surface layer for accommodating a bending portion of the energy band. The superlattice structure is formed of a multilayer in which a strained well layer and a barrier layer are alternately laminated plural times. The strained well layer has a lattice constant greater than that of the substrate and a thickness equal to or less than a wavelength of electron wave, and the barrier layer has a conduction band lower in energy than that of the strained well layer and a thickness such that an electron in the conduction band can transmit based on tunnel effect. A difference in energy between the band for heavy holes and the band for light holes is further widened in the valence band of the superlattice structure due to compressive stress in the strained well layer.

19 Claims, 4 Drawing Sheets

Fig. 1A
PRIOR ART
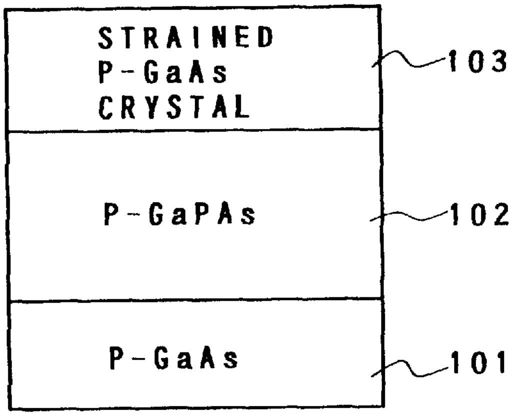
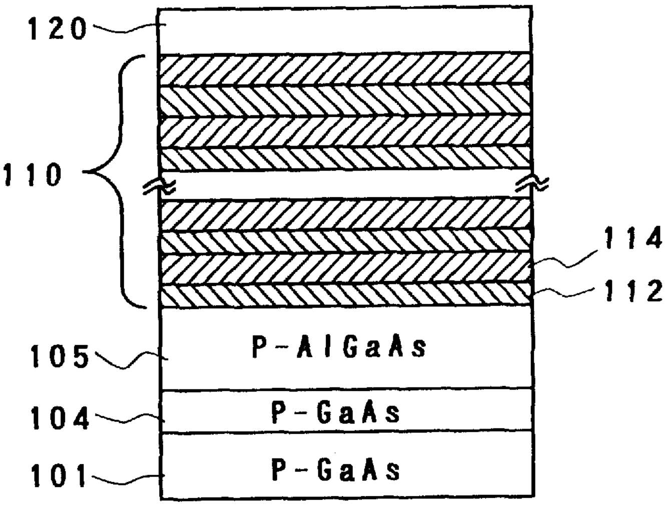
Fig. 1B PRIOR ART

SPIN POLARIZED ELECTRON SEMICONDUCTOR SOURCE AND APPARATUS UTILIZING THE SAME

This is a continuation of copending application Ser. NO. 08/452,884 filed on May 30, 1995 now abandoned.

BACKGROUND OF THE INVENTION

1. Field of the Invention

The present invention relates to a spin polarized electron semiconductor source and an apparatus utilizing the same, and more particularly, to improvement of spin polarization and quantum efficiency in the spin polarized electron semiconductor source.

2. Description of the Related Art

The charged weak bosons couple only chirality-left quarks and leptons. In high energy interactions of massless limit, the chirality equals the helicity. A polarized electron beam, therefore, can control weak interactions in high energy experiments, and is expected to play important roles in experiments of $e^+e^-$ linear colliders. In the experiments using polarized electron beams, in most cases, the sensitivities of the experiments increase proportionally to the square of the spin polarization degree. Therefore, a spin polarized electron source as a photocathode by which electrons having as high spin polarization as possible can be extracted is urgently required. Besides the degree of spin polarization, the amount of charge which can be extracted from the spin polarized electron source is important in the collider. Therefore, it is desirable for a spin polarized electron semiconductor source to satisfy a spin polarization close to 100% for electrons having an aligned spin and a high quantum efficiency for a large current.

As such a spin polarized electron source for extracting spin polarized electrons, an example in which the band structure of a bulk semiconductor is utilized is described in a paper (Solid State Communication, Vol. 16, p. 877, 1975) by G. Lanpel et al. In this spin polarized electron semiconductor source, a multilayer in which Cesium (Cs) layers and oxygen (O) layers are alternately laminated is deposited on the surface of a p-type GaAs semiconductor to produce a negative electron affinity. Electrons having a maximum spin polarization of 50% can be extracted from the semiconductor surface by irradiating it with a circularly polarized laser beam having an energy substantially equal to the forbidden band of GaAs. In the band structure of the GaAs semiconductor, a band for heavy holes and a band for light holes are degenerated in the valence band and therefore the ratio of electrons having a downward spin to electrons having an upward spin is 3:1 because of the difference in transition probability when electrons are excited from these bands to the conduction band. For this reason, the maximum polarization of 50% can be obtained.

In order to obtain a further higher polarization close to 100%, it is necessary to remove the degeneracy of the heavy hole band and the light hole band in the valence band. For this purpose, spin polarized electron sources utilizing strained crystal or a short period of a semiconductor superlattice structure are proposed.

As an example of a spin polarized electron semiconductor source utilizing strained crystal there is the paper (Physics Letters A., Vol. 158, p. 345, 1991) by T. Nakanishi et al. FIG. 1A shows the structure of such a spin polarized electron semiconductor source utilizing strained crystal. In the example, a lattice relaxation layer 102 of p-type GaPAs which has a lattice constant greater than that of a p-type GaAs substrate 101 and no lattice relaxation is provided on the substrate 101, and a thin strained layer 103 of p-type GaAs in which lattice relaxation is not generated is provided on the lattice relaxation layer 102. A compressive stress acts due to the strain in a direction along the plane in the uppermost GaAs strained layer 103 to align the lattice of the strained layer 103 with the lattice of the relaxation layer 102. As a result, the degeneracy of the heavy hole band and the light hole band is removed in the valence band so that the heavy hole band is positioned higher in energy than the light hole band. Therefore, if the energy of exciting light is chosen to be equal to the energy from the heavy hole band to the conduction band, i.e., a forbidden band energy, electrons are excited only from the heavy hole band so that electrons having completely aligned spin can be obtained. In this manner, spin polarization of 100% ought to be achieved in theory. However, the spin polarization of extracted electrons is lower than 100% in reality because of extension of bands by thermal energy and spin scattering in the strained crystal. As a result of an experiment in which the spin polarization of electrons extracted from the surface of an alternate lamination multilayer of Cs and O formed on the strained layer 103 is measured, a high polarization of 80% or above was obtained.

On the other hand, an example of a spin polarized electron semiconductor source device using a superlattice structure of a short period is described in, for example, a paper (Physical Review Letters, Vol. 67, p. 3294, 1991) by Omori el at. The structure of the electron semiconductor source device using the superlattice structure is shown in FIG. 1B. On a substrate 101 of p-type GaAs, there are sequentially formed a buffer layer 104 of p-type GaAs and a block layer 105 of p-type AlGaAs having a wide forbidden band. The buffer layer 104 is formed to provide a flat surface and the block layer 105 is formed to prevent electrons excited in the substrate 101 from going into a superlattice structure 110. The superlattice structure 110 having a short period is formed on the block layer 105. In the superlattice structure, a well layer 112 of p-type GaAs having a thickness equal to or shorter than a wavelength of electron wave and a barrier layer 114 of p-type AlGaAs having a thickness through which an electron can transmit due to the tunnel effect are alternately laminated. A protection layer 120 of As is formed on the superlattice structure 110. In this case, the degeneracy for heavy holes and light holes is removed in the superlattice structure 110 and a mini band for the heavy holes and a mini band for the light holes are formed in the valence band due to quantum effect. These mini bands occupy different energy levels because of a great difference in effective mass. As a result, similar to the case of the strained crystal, the mini band for the heavy holes takes a position higher in energy than that of the mini band for the light holes. Accordingly, if exciting light is chosen to have the energy from the mini band for the heavy holes to a conduction band and is irradiated to the semiconductor source with a circular polarization, electrons can be excited only from the mini band for the heavy holes and can have completely aligned spins. Therefore, electrons having spin polarization of 100% ought be obtained in theory. As a result of are experiment in which spin polarization of electrons extracted from the surface of a device in which a CsO multilayer was laminated on the surface was measured, a high spin polarization over 70% was obtained.

As described above, when that the GaAs non-strained crystal or the superlattice structure is used as in the conventional spin polarized semiconductor electron source, although the quantum efficiency is relatively high, the spin polarization is insufficient. On the other hand, when the strained crystal is used for the spin polarized electron semiconductor source, although a great polarization is obtained, the quantum efficiency is as low as 0.5% or below because there are defects in the crystal due to the doped impurity and the strained crystal layer cannot be made thicker. In this manner, a high spin polarization and a high quantum efficiency could not be both satisfied simultaneously.

SUMMARY OF THE INVENTION

An object of the present invention is to provide a spin polarized electron semiconductor source in which a high spin polarization and a high quantum efficiency can be achieved.

Another object of the present invention is to provide an apparatus utilizing the above spin polarized electron semiconductor source.

In order to achieve an aspect of the present invention, a structure of an electron source includes a superlattice structure formed above a substrate, for generating electrons due to input light, and comprising a plurality of layers, in each of which a strained well layer and a barrier layer are laminated, a material of the strained well layer having a lattice constant different from that of a material of the substrate not to have lattice relaxation and having a thickness equal to or less than a wavelength of electron wave, and the barrier layer having a thickness such that an electron can transmit the barrier layer based on tunnel effect and a valence band energy lower than that of the strained well layer, and a surface layer formed on the superlattice structure, for emitting the electrons generated by the superlattice structure.

In order to achieve another aspect of the present invention, an electron source device includes a vacuum chamber, an electron source provided in the vacuum chamber, wherein the electron source includes a substrate, a block layer for blocking injection of electron from the substrate, a superlattice structure of no lattice relaxation formed on the block layer such that a first layer and a second layer are alternately laminated plural times, one of the first and second layer having a lattice constant different from that of a material of the substrate such that a band for heavy holes and a band for light holes are split and formed, the superlattice structure transiting electrons from the heavy hole band to a conduction band in response to an input light beam, and a surface layer formed on the superlattice structure, for emitting the electrons in the conduction band of the superlattice structure, a power supply having a positive terminal connected to the surface layer and a negative terminal connected to the substrate, for supply a DC voltage to the electron source in a pulse manner, means for forming on the surface layer a layer having a negative electron affinity, and a light source for outputting to the electron source the light beam having a wavelength corresponding to an energy difference between the conduction band and the heavy hole band.

In order to achieve still another aspect of the present invention, a structure of an electron source, includes a substrate, a block layer for blocking injection of electron from the substrate, a superlattice structure formed on the block layer and having a strain of a lattice structure without lattice relaxation, for forming a band for heavy holes and a band for light holes, electrons being excited from the heavy hole band to a conduction band in response to an input light beam, and a surface layer formed on the superlattice structure, for emitting the electrons excited in the superlattice structure.

The superlattice structure is formed by alternately laminating a first layer and a second layer. The first layer the second layer are thin and the superlattice structure has a plurality of short periods of the first and second layers. The first layer is one of the strained well layer and the barrier layer and the second layer is the other. The first layer as the strained well layer has a lattice constant different from that of the substrate such that the super lattice structure has the strain of the lattice structure.

At least a part of the barrier layers may be formed of a material having substantially the same lattice constant as that of a material of the substrate or may be formed of a material having a lattice constant such that an average of the lattice constant of the material of the strained well layer and that of a material of the barrier layer is about equal to the lattice constant of the material of the substrate.

The strained well layer and the barrier layer may include p-type impurities of substantially the same density, or one of the strained well layer and the barrier layer may be a substantially intrinsic layer and the other may include a p-type impurity. In this case, the impurity density is desirably in a range of $5\times10^{16}$ $cm^{-3}$ to $1\times10^{18}$ $cm^{-3}$.

The superlattice structure may have a thickness such that the superlattice structure can utilize the input light sufficiently to excite the electrons from a valence band to a conduction band. If an average of lattice constants of the strained well and barrier is substantially equal to a lattice constance of the substrate, the superlattice structure may be formed to have a thickness enough to utilize an input light beam.

The surface layer includes a p-type impurity of a density higher than those of the strained well layer and the barrier layer to provide a proper electron affinity so that the surface layer can accommodate a bent portion of the energy band on a side of the surface layer of the electron source structure when a power is supplied between the substrate and the surface layer.

In the semiconductor spin polarized electron source according to the present invention, compressive stress is applied to the well layer of the superlattice structure so that an energy difference between bands for heavy holes and light holes which bands are caused due to the superlattice structure is further increased. For this reason, only electrons in the band for the heavy holes can be selectively and readily light-excited to the conduction band. As a result, electrons having a spin polarization higher than that of the conventional structure of spin polarized electron source as well as a high quantum efficiency can be taken out.

BRIEF DESCRIPTION OF THE DRAWINGS

FIGS. 1A and 1B are diagrams showing conventional devices which use a strained crystal and a non-strained superlattice structure, respectively;

DESCRIPTION OF THE PREFERRED EMBODIMENTS

The spin polarized electron semiconductor source apparatus according to the present invention will be described below with reference to the accompanying drawings.

Figure 2:
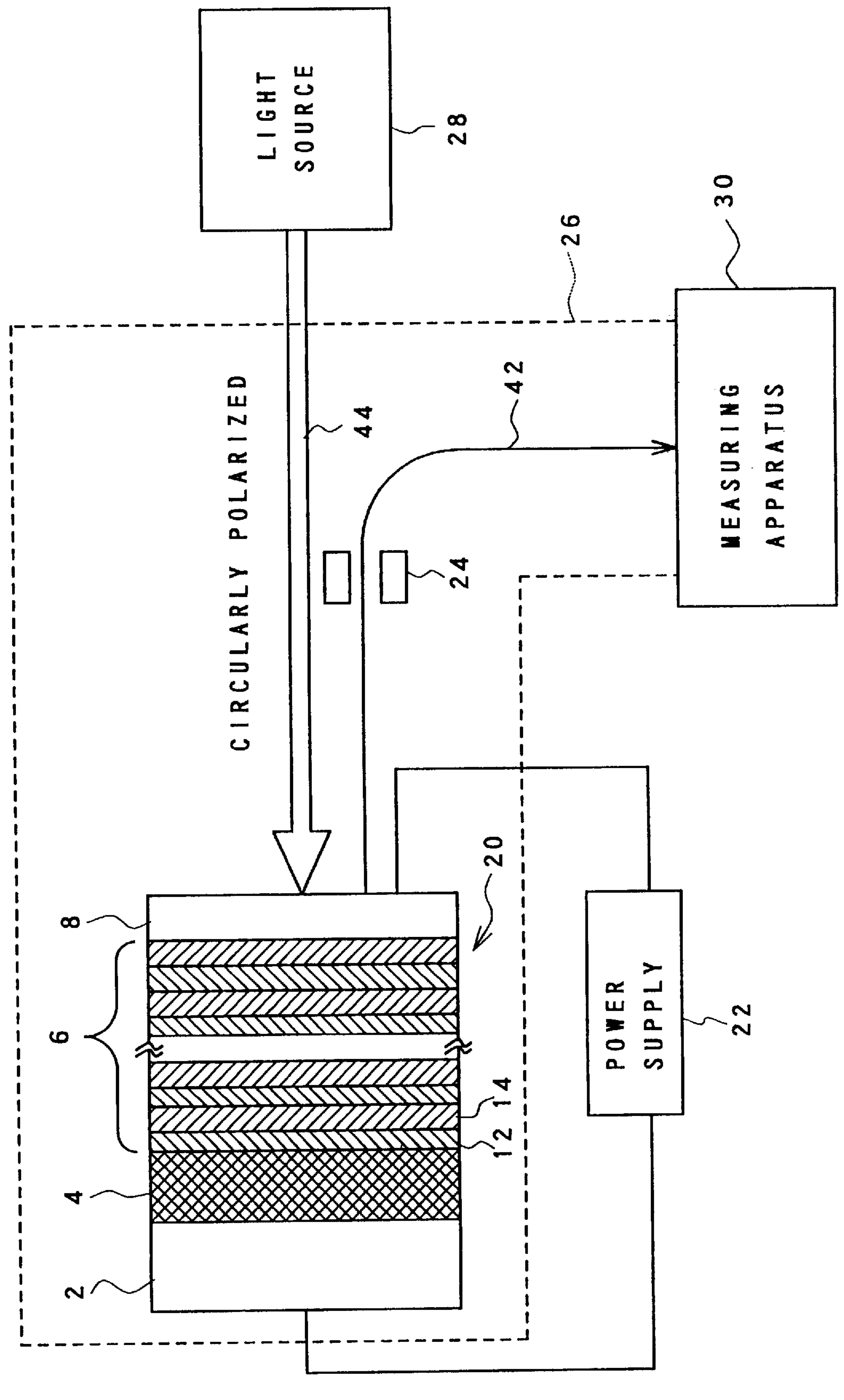
FIG. 2 is a diagram showing a spin polarized electron semiconductor source apparatus according to the present invention using a strained superlattice structure in a semiconductor source wherein the strained superlattice structure is employed in the first to fifth embodiments of the present invention.

FIG. 2 is a schematic diagram showing the spin polarized electron semiconductor source apparatus according to a first embodiment of the present invention. As shown in FIG. 2, the apparatus includes a spin polarized electron semiconductor source 20, a power supply 22 for supplying a DC voltage to the semiconductor source 20, and a light exciting apparatus 28 having a laser unit for supplying a light beam having a circular polarization and having a specific energy or wavelength to the semiconductor source 20. The semiconductor source 20 is accommodated in a vacuum chamber 26 and emits spin polarized electrons 42 when a bias is applied to the semiconductor source 20 by the power supply 22 and the light beam is irradiated to the semiconductor source 20 by the light source 28. The emitted electrons 42 are deflected by a deflector 24 and inputted to a measuring apparatus 30 such as a Mott polarization analyzer for measuring spin polarization and a quantum efficiency.

In the semiconductor source 20, on a substrate 2 of p-type GaAs are sequentially formed a block layer 4 of p-type p-type $Al_{0.35}Ga_{0.65}As$, a superlattice structure 6, and a surface layer 8 of $p^{30}$-type $In_{0.15}Ga_{0.85}As$. The block layer 4 has a thickness of 1 $\mu$m and a Be acceptor density of $5\times10^{18}$ $cm^{-3}$ and prevents electrons generated in the substrate 2 from going into the superlattice structure 6. In the superlattice structure 6, a strained well layer 12 and a barrier layer 14 are alternately laminated. The strained well layer 12 is made of a material having a lattice constant greater than that of the substrate 2 with compressive stress applied inside a plane and has a thickness equal to or less than a wavelength of an electron wave. In this embodiment, the strained well layer 12 is formed of p-type $In_{0.15}Ga_{0.85}As$ and has a thickness of 2.0 nm and a Be density of $5\times10^{17}$ $cm^{-3}$. The barrier layer 14 is formed of the same material as that of the substrate 2 in this embodiment and has a thickness such that an electron can transmit the barrier layer 14. In this embodiment, the barrier layer 14 is formed of p-type GaAs, has a thickness of 3.1 nm and a Be density of $5\times10^{17}$ $cm^{-3}$. The strained well layer 12 and the barrier layer 14 constitute a single short period of the superlattice structure 6. The superlattice structure includes a plurality of periods, e.g., 18 periods (corresponding to 91.8 nm) in this embodiment. The surface layer 8 accommodates a bending portion of a band structure of the semiconductor source 20 when the DC voltage is applied and has a thickness of 4.8 nm and a Be density of $4\times10^{19}$ $cm^{-3}$ in this embodiment. A cap layer of As (not shown) is provided on the surface layer 8 for surface passivation in a manufacturing process and it is removed in the measurement.

Next, the method of manufacturing the electron semiconductor source 20 according to the first embodiment of the present invention will be described below.

The manufacture of the electron semiconductor source 20 of the present invention is performed at a substrate temperature of 520° C. using molecular beam epitaxy (MBE) as a crystal growth method. First, the block layer 4 of p-type $Al_{0.35}Ga_{0.65}As$ is formed on the substrate 2 of p-type GaAs so as to have a flat surface, a thickness of 1 $\mu$m and a Be acceptor density of $5\times10^{18}$ $cm^{-3}$. Subsequently, the superlattice structure 6 having a plurality of short periods of the strained well layer 12 and the barrier layer 14 which are alternately laminated is formed on the block layer 4. The strained well layer 12 of a p-type $In_{0.15}Ga_{0.85}As$ is formed so as to have a thickness of 2.0 nm and a Be density of $5\times10^{17}$ $cm^{-3}$ and the barrier layer 14 of p-type GaAs is formed so as to have a thickness of 3.1 nm and a Be density of $5\times10^{17}$ $cm^{-3}$. An alternate layer of the strained well layer 12 and barrier layer 14 is repeated plural periods, e.g., 18 periods (corresponding to 91.8 nm) in this embodiment. Finally, the surface layer 8 of $p^{+}$-type $In_{0.15}Ga_{0.85}As$ is formed so as to have a thickness of 4.8 nm and a Be density of $4\times10^{19}$ $cm^{-3}$. Thereafter, the temperature of the substrate is cooled to −10° C. and an As protection film of about 1 $\mu$m is deposited to suppress oxidization of the surface in the atmosphere. Thus, the device is completed.

Next, the method of measuring the spin polarization and the quantum efficiency of the electron semiconductor source 20 will be described below.

Figure 5:
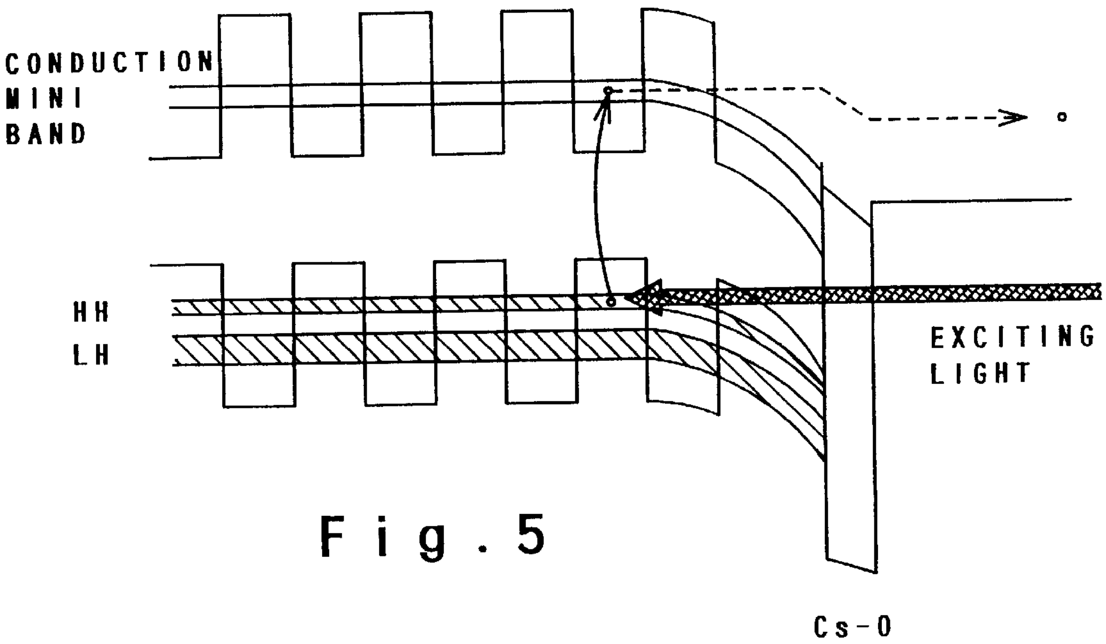
FIG. 5 is a diagram showing the emission of spin polarized electrons when an exciting light beam is irradiated.

The vacuum chamber 26 was evacuated to the base pressure of about $6\times10^{-10}$ torr. After being introduced into the ultra-high vacuum chamber 26, the semiconductor source 20 was heated up to 400° C. such that the As protection film was vaporized and removed from the surface so that a clean surface could be obtained. Then, a multilayer of Cs and O was formed on the surface from which the As layer is removed, to obtain a negative electron affinity (NEA). Thereby, the preparation for measurement was completed. The polarization measurement was performed at room temperature. A high voltage was applied to the semiconductor source 20 by the power supply 22 such that the surface layer 8 was at a ground voltage and the substrate 2 was at about −4 kV. As shown in FIG. 5, the light source 28 included a CW titanium: sapphire laser which was excited by an argon laser and circularly polarized monochromatic light beam of 915 nm with power of 100 $\mu$W was irradiated from the light source 28 to the semiconductor source 20 through a quarter-wave plate. Electrons extracted from the semiconductor source 20 were accelerated up to 100 keV and deflected by a deflector 24 such that the electrons were inputted to the Mott polarization analyzer 30. As a result when the spin polarization and quantum efficiency of the semiconductor source 20 were measured, a maximum spin polarization of 87% and a maximum quantum efficiency of 2% were obtained. That is, both the high spin polarization and high quantum efficiency were satisfied simultaneously.

Figure 3A:
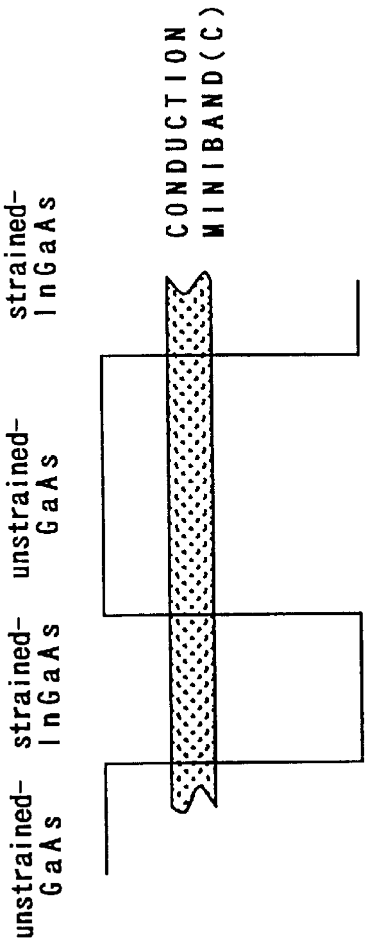
FIG. 3A and 3B are diagrams showing an energy band in the strained superlattice structure.
Figure 3B:
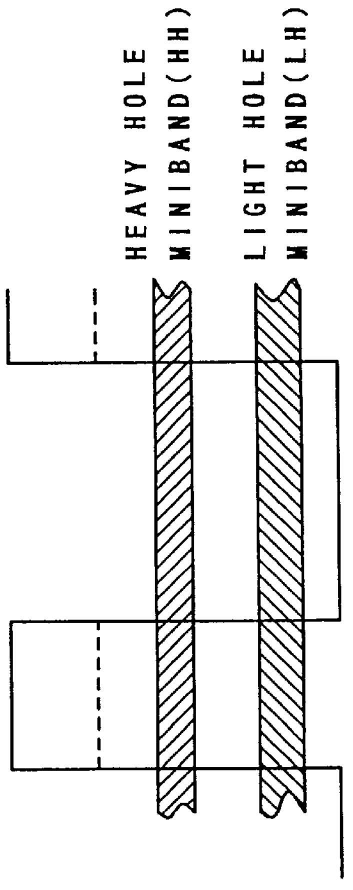

In the first embodiment, as shown in FIG. 3, in the superlattice structure 6 composed of an alternate lamination of the strained well layer 12 and the barrier layer 14, mini bands are formed for the heavy holes and light holes due to quantum effect. As a result, the degeneracy of heavy hole band and light hole band is removed in the valence band such that these band respectively have different energy levels. In this case, the heavy hole has a large effective mass and takes an energy level slightly lower than that of the heavy hole band of crystal GaAs and, therefore, the energy level shift of the heavy hole mini band is not distinguishable. On the other hand, the light hole has a small effective mass and the energy level of the light hole mini band is moved into a low energy level direction with a large extent from the energy level of the crystal GaAs and, therefore, the energy level shift of the light hole mini band is distinguishable. In this case, since the material of the strained well layer 12 has a lattice constant greater than those of the substrate 2 and the barrier layer 14, compressive stress acts in a direction along the plane for matching between the lattice of the strained well layer 12 and that of the barrier layer 14 so that the strained well layer is strained such that a distance between lattices in a lamination direction is elongated. As a result, the energy difference between the heavy hole mini band and the light hole mini band becomes further wider compared to a case of the strained crystal in which the lattices are strained only.

In this manner, in the superlattice structure having a plurality of short periods of the strained well layer 12 and barrier layer 14, it can be more completely limited to electrons in the heavy hole mini band that transit to the conduction band due to optical excitation. Therefore, electrons excited into the conduction mini band and having a spin polarization of substantially to 100% are generated in the semiconductor source 20 and are drifted toward the surface layer 8. In this case, if the Be dose amount is less, the number of electrons excited will be reduced. However, if the Be dose amount is more, lattice defects are formed due to the acceptor impurity in the semiconductor source 20 which cause spin scattering, so that the spin polarization will be reduced. Therefore, the Be density of the strained well layer 12 or the barrier well layer 14 is desirable in a range of $1\times10^{16}$ to $1\times10^{18}$ $cm^{-3}$.

Figure 4A:
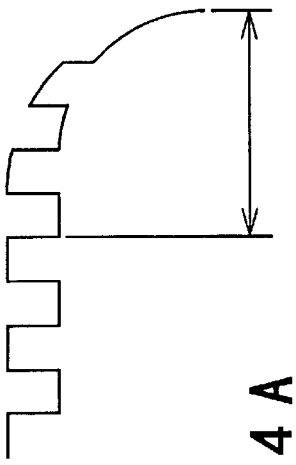
FIGS. 4A and 4B are diagrams for explaining bent portions of a surface layer of the semiconductor source.
Figure 4B:
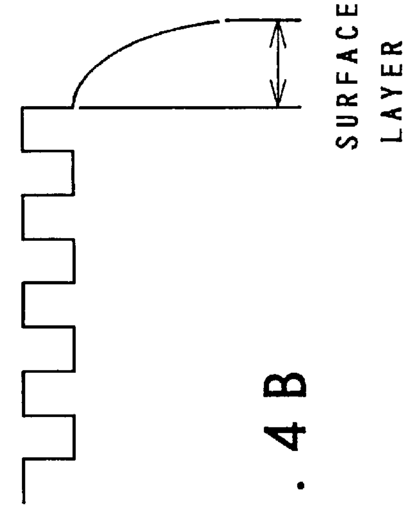

Since the width of the mini conduction band is sufficiently wide because the superlattice structure is composed of a plurality of short periods, the electrons have a high electron mobility as in bulk crystal. For this reason, the spin polarized electrons can move to the surface layer 8 in a short time during in which they are not subjected to spin scattering. In the surface layer 8, the electrons are accelerated due to a great internal electric field so as to go out of the semiconductor source 20. In this case, if the acceptor density of the surface layer 8 is as much as that of strained well or barrier layer, a portion of the superlattice structure 6 is bent as well as the surface layer 8 such that spin scattering is caused, as shown in FIG. 4A. Therefore, it is desirable that the bent portion is accommodated only in the surface layer 8 as shown in FIG. 4B. For this purpose, it is required for the surface layer 8 to be heavily doped with Be. However, if the acceptor density of the surface layer 8 is too much, the surface layer 8 does not have a good match to the Cs-O multilayer with respect to electron affinity. Hence, it is desirable for the surface layer 8 to have thickness of about 4.8 nm and Be density in the range of $1\times10^{19}$ to $1\times10^{20}$ $cm^{-3}$.

Further, since there is not generated lattice relaxation from the substrate to the top layer in the superlattice structure 6, i.e., there is almost no crystal defect, the recombination of excited electrons is not generated. In addition, since the semiconductor source 20 can be designed to have the photon absorption region thicker than the strained crystal, the exciting light can be utilized effectively so that a high quantum efficiency can be achieved.

As described above, electrons having a high spin polarization close to 100% can be taken out with a high quantum efficiency in the spin polarized electron semiconductor source 20 according to the first embodiment of the present invention.

(SECOND EMBODIMENT)

Next, the spin polarized electron semiconductor source apparatus according to the second embodiment of the present invention will be described below. In this embodiment, the structure diagram shown in FIG. 2 is used and the substrate 2, the block layer 4, a strained well layer 12, the barrier layer 14, and the surface layer 8 are formed of p-type GaAs, p-type $Al_{0.35}Ga_{0.65}As$, p-type $In_{0.15}Ga_{0.85}As$, p-type $Al_{0.35}Ga_{0.65}As$, and $p^+$-type $In_{0.15}Ga_{0.85}As$, respectively.

The manufacturing method of the semiconductor source according to the second embodiment of the present invention is substantially the same as in the first embodiment. The structure of semiconductor source 20 is the same as in the first embodiment other than using the barrier layer 14 of p-type $Al_{0.35}Ga_{0.65}As$ having a thickness of 3.1 nm and a Be density of $5\times10^{17}$ $cm^{-3}$. As a result when the spin polarization and quantum efficiency of the semiconductor source 20 were measured under a condition of irradiation power of 100 $\mu$W in the CW mode using an exciting laser having a wavelength of 830 nm, a maximum spin polarization of 90% and quantum efficiency of 2% were obtained. That is, spin polarization higher than in the first embodiment could be obtained, resulting in achieving high performance.

This is because the AlGaAs having a forbidden band wider than that of the material of the substrate 2 is used as the material of the barrier layer 14 and, therefore, an energy difference between the mini band for the heavy holes and the mini band for the light holes becomes greater than in the first embodiment so that spin polarization is further improved over that of the first embodiment.

(THIRD EMBODIMENT)

The semiconductor spin polarized electron source according to the third embodiment of the present invention will be described below. In the semiconductor source 20 in this embodiment the structure shown in FIG. 2 is also used and the substrate 2, the block layer 4, a strained well layer 12, the barrier layer 14, and the surface layer 8 are formed of p-type GaAs, p-type $Al_{0.35}Ga_{0.65}As$, p-type $In_{0.15}Ga_{0.85}As$, p-type $GaP_{0.2}As_{0.8}$, and $p^+$-type $In_{0.15}Ga_{0.85}As$, respectively.

The manufacturing method of the semiconductor source 20 according to the third embodiment of the present invention is substantially the same as in the first embodiment. The structure of the semiconductor source 20 is the same as in the first embodiment except that the barrier layer 14 of p-type $GaP_{0.2}As_{0.8}$ has a thickness of 3.1 nm and a Be density of $5\times10^{17}$ $cm^{-3}$ is used and the thickness of superlattice structure layer is 300 nm as a whole. As a result when the spin polarization and quantum efficiency of the semiconductor source 20 were measured under a condition of irradiation of 100 $\mu$W in the CW mode using an exciting laser having a wavelength of 880 nm, a maximum spin polarization of 88% and quantum efficiency of 4% were obtained. That is, spin polarization higher than in the first embodiment and quantum efficiency higher than in the first and second embodiments were obtained, resulting in achieving high performance.

Since $GaP_{0.2}As_{0.8}$ having a lattice constant smaller than that of the GaAs substrate 2 is used as the barrier layer 14, if the barrier layer 14 is used in combination with the $In_{0.15}Ga_{0.85}As$ strained well layer 12 having a lattice constant greater than that of the GaAs substrate 2, the average lattice constant of the strained well layer 12 and the barrier layer 14 can be set to be substantially the same as that of the GaAs substrate 2. As a result, the thickness of the superlattice structure 6 can be made thicker without lattice relaxation. For this reason, quantum efficiency can be improved more than in the first and second embodiments.

(FOURTH EMBODIMENT)

The spin polarized electron semiconductor source apparatus according to the fourth embodiment of the present invention will be described below. In the semiconductor source 20 of the fourth embodiment the structure shown in FIG. 1 is used. The substrate 2, the block layer 4, a strained well layer 12, the barrier layer 14, and the surface layer 8 are formed of p-type GaAs, p-type GaAs, intrinsic type $In_{0.15}Ga_{0.85}As$, p-type GaAs, and $p^+$-type $In_{0.15}Ga_{0.85}As$, respectively.

The manufacturing method of the semiconductor source 20 according to the fourth embodiment of the present invention is substantially the same as in the first embodiment. The structure of semiconductor source 20 is the same as in the first embodiment except that a p-type $Al_{0.35}Ga_{0.65}As$ having a thickness of 3.1 nm and a Be density of $5\times10^{17}$ $cm^{-3}$ is used as the barrier layer 14 and the undoped intrinsic type $In_{0.15}Ga_{0.85}As$ material of 2.0 nm is used as the strained well layer 12. As a result when the spin polarization and quantum efficiency of the semiconductor source 20 were measured under a condition of irradiation power of 100 $\mu$W in the CW mode using an exciting laser having a wavelength of 915 nm, a spin polarization of 87% and quantum efficiency of 3% were obtained. That is, quantum efficiency higher than in the first embodiment was obtained, resulting in achieving high performance.

Since the strained well layer 12 does not contain ionized impurity, there is less recombination generated due to lattice defect caused by the presence of such impurities. This effect influences the quantum efficiency greatly because the probability that excited spin polarization electrons are in the strained well layer 12 is greater than the probability that they are in the barrier layer 14. Therefore, quantum efficiency higher than in the first embodiments can be obtained.

(FIFTH EMBODIMENT)

The spin polarized electron semiconductor source apparatus according to the fifth embodiment of the present invention will be described below. In the semiconductor source 20 of the fifth embodiment, the structure shown in FIG. 2 is used and the substrate 2, the block layer 4, a strained well layer 12, the barrier layer 14, and the surface layer 8 are formed of p-type GaAs, p-type $Al_{0.35}Ga_{0.65}As$, p-type $In_{0.15}Ga_{0.85}As$, undoped intrinsic-type GaAs, and $p^+$-type $In_{0.15}Ga_{0.85}As$, respectively.

The manufacturing method of the semiconductor source 20 according to the fifth embodiment of the present invention is substantially the same as in the first embodiment. The structure of semiconductor source 20 is the same as in the first except that undoped intrinsic-type GaAs having a thickness of 3.1 nm is used as the barrier layer 14 and the p-type $In_{0.5}Ga_{0.85}As$ of 2.0 nm and BE density of $5\times10^{17}$ $cm^{-3}$ is used as the strained well layer 12. As a result when the spin polarization and quantum efficiency of the device were measured under a condition of irradiation power of 100 $\mu$W in the CW mode using an exciting laser having a wavelength of 915 nm, a spin polarization of 89% and quantum efficiency of 2% were obtained. That is, spin polarization higher than in the first embodiment was obtained, resulting in achieving high performance.

Since the strained well layer 12 contains acceptor impurity but the barrier layer 14 does not contain it, the energy band is bent at many portions in the superlattice structure 6 due to space charge. The bent portions of the energy band makes the effective barrier height against holes higher. As a result, the energy difference between the mini band for the heavy holes and the mini band for the light holes becomes greater than in the first embodiment. Therefore, spin polarization larger than in the first embodiment can be obtained.

In the above-mentioned embodiments of the present invention, only GaAs is used for the substrate. However, it is apparent that compound semiconductor such as InP, InAs, GaSb, and GaP and element semiconductor such as Si and Ge may be used as the substrate or other single crystal semiconductor substrate and single crystal metal substrate may be used. Only GaAs, InGaAs, AlGaAs and GaPAs are shown in the above description as semiconductor material constituting the strained superlattice structure. However, it will be apparent that any combination of semiconductor materials which satisfies the constraints indicated for the present invention is possible and that representative compound semiconductor such as InP, InAlAs, InAlGaAs, AlGaPAs, GaSb, AlGaSb, InAs, GaP, GaN, and AsGaN and other semiconductors may be used.

As the block layer only AlGaAs is shown. However, another semiconductor material having an electron affinity smaller than that of the substrate may be used. Further, although only InGaAs is shown as the material of the surface layer which is the same as the material of the strained well layer, the material of the surface layer may be the same as the material of the barrier layer or another semiconductor material may be used having electron affinity not as small as that of the material of the short period of the superlattice. Furthermore, only As is shown as the protection film from oxidization in the atmosphere. However, a material such as Sb and InAs vaporizing at a temperature at which the superlattice structure is not damaged may be used for the protection film.

The first to fifth embodiments are disclosed in the present invention. It will be apparent that the semiconductor spin polarized electron source according to the present invention can be realized using a combination of features of the first to fifth embodiments. For instance, in the second to fifth embodiments, two of three conditions, i.e., the composition of barrier layer, presence/absence of strain in the barrier layer, and a layer in which impurity is doped are fixed and only one condition is changed. However, it is apparent that performance of the device higher than in the first embodiment can be obtained even when two or more conditions are changed.

Figure 6:
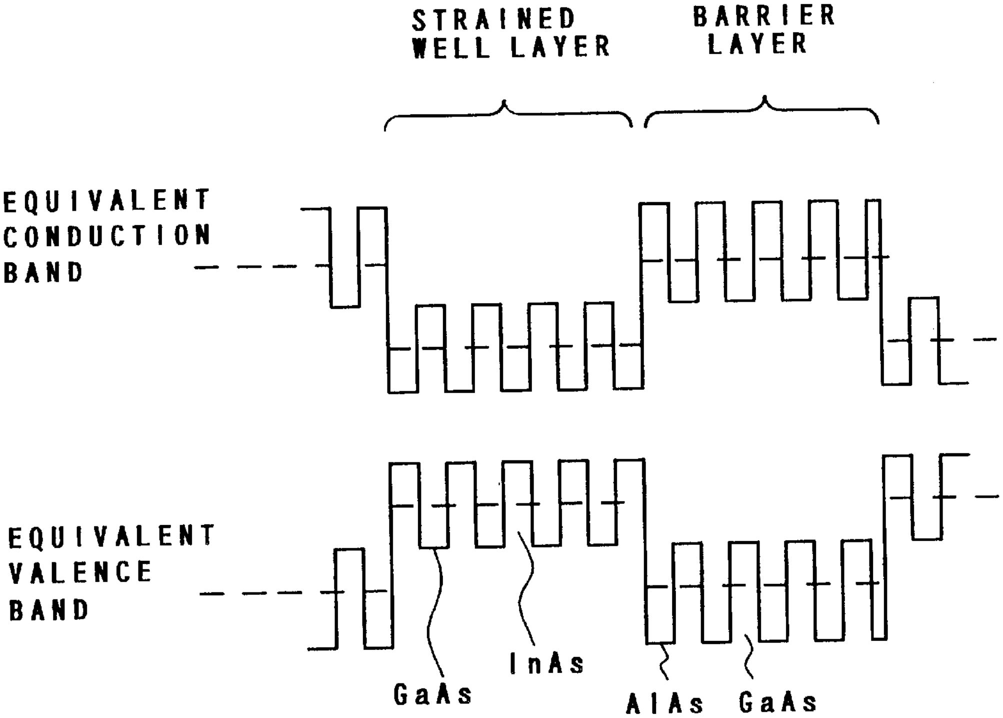
FIG. 6 is a diagram showing the strained superlattice structure when each layer of the superlattice structure is formed of a plurality of sublayers.

In addition, it is apparent that the strained well layer or barrier layer may be divided into a plurality of sublayers which have different compositions as shown in FIG. 6. In FIG. 6, the strained well layer is formed of a multilayer in which a GaAs sublayer and an InAs sublayer are alternately laminated plural times and the barrier layer is formed of a multilayer in which an AlAs sublayer and a GaAs sublayer are alternately laminated plural times. The sublayer structures function as the InGaAs layer and the AlGaAs layer, respectively.

According to the spin polarized electron semiconductor source of the present invention, a large amount of electrons having a great spin polarization can be taken out and operation life can be extended because the semiconductor spin polarized electron source operates with a weak exciting light intensity.

What is claimed is:

1. A semiconductor electron source structure comprising:

a semiconductor substrate;

a blocking layer formed on said semiconductor substrate;

a superlattice structure formed by alternately laminating a strained well layer and a barrier layer, such that a light hole miniband and a heavy hole miniband are split in a valence band and a conduction miniband is formed in a conduction band, wherein said barrier layer has a band gap greater than that of said strained well layer, and wherein said strained well layer has a lattice constant greater than said substrate and said barrier layer thereby increasing the energy difference between said heavy and light hole minibands; and a surface layer formed on said superlattice structure such that a bending portion of a band structure of said electron source can be accommodated when a DC voltage is applied to said electron source.

2. The electron source structure according to claim 1, wherein said strained well layer and said barrier layer are selected from p-type and intrinsic type layers, and said surface layer is p-type and is formed such that acceptors are more heavily doped than one of said strained well layer and said barrier layer and having more heavily doped acceptors such that said surface layer matches a layer which has negative electron affinity and which is formed later on said surface layer.

3. The electron source structure according to claim 2, wherein an acceptor doping level is in a range of $1\times10^{16}$ to $1\times10^{18}$ in at least one of said strained well layer and said barrier layer and an acceptor doping level is in a range of $1\times10^{19}$ to $1\times10^{20}$ in said surface layer.

4. The electron source structure according to claim 1, wherein a material of said strained well layer has a lattice constant different from that of a material of the substrate not having lattice relaxation, and has a thickness equal to or less than a wavelength of an electron wave, and said barrier layer has a thickness such that an electron can transmit said barrier layer based on tunnel effect.

5. The electron source structure according to claim 4, wherein at least a part of said barrier layer is formed of a material having substantially the same lattice constant as that of a material of said.

6. The electron source structure according to claim 1, wherein said barrier layer is formed of a material having a lattice constant such that an average of a lattice constant of a material of said strained well layer and that of the material of said barrier layer is about equal to a lattice constant of a material of said substrate.

7. The electron source structure according to claim 6, wherein said superlattice structure has a thickness such that input light can be utilized to excite electrons in said source structure from a valence band to a conduction band.

8. The electron source structure according to claim 1, wherein said strained well and barrier layers include p-type impurities of substantially the same density and said surface layer has a p-type impurity density higher than the p-type impurity density of said strained well and barrier layers.

9. The electron source structure according to claim 1, comprising a plurality of strained well layers and a plurality of barrier layers, and wherein each of said strained well layers is a substantially intrinsic layer and a part of said barrier layers includes a p-type impurity.

10. The electron source structure according to claim 1, comprising a plurality of strained well layers and a plurality of barrier layers, and wherein a part of said strained well layers includes a p-type impurity and a part of said barrier layers is a substantially intrinsic layer.

11. An electron source device comprising:

a vacuum chamber:

an electron source provided in said vacuum chamber, comprising:

a substrate.

a block layer for blocking injection of electrons from said substrate, a superlattice structure formed by alternately laminating a strained well layer and a barrier layer, such that a light hole miniband and a heavy hole miniband are split in a valence band and a conduction miniband is formed in a conduction band, wherein said barrier layer has a band gap greater than that of said strained well layer, and said strained well layer has a lattice constant greater than said substrate and said barrier layer thereby increasing the energy difference between said heavy and light hole minibands;

a surface layer formed on said superlattice structure such that a bending portion of a band structure of said electron source can be accommodated when a DC voltage is applied to said electron source;

a power supply having a positive terminal connected to said surface layer and a negative terminal connected to said substrate, said power supply being for supplying a pulsed DC voltage to said electron source;

means for forming on said surface layer a layer having a negative electron affinity; and a light source for outputting to said electron source the light beam having a wavelength corresponding to an energy difference between the conduction miniband and the heavy hole miniband.

12. An electron source structure, comprising:

a substrate;

a block layer for blocking injection of electron from said substrate;

a superlattice structure formed on said block layer by alternately laminating a strained well layer and a barrier layer, and having a strain of a lattice structure, such that a light hole miniband and a heavy hole miniband are split in a valence band and a conduction miniband is formed in a conduction band, wherein said barrier layer has a band gap greater than that of said strained well layer, and said strained well layer has a lattice constant greater than aid substrate and said barrier layer thereby increasing the energy difference between said heavy and light hole minibands; and a surface layer formed on said superlattice structure, such that said surface layer can accommodate a bent portion of an energy band structure of the electron source structure when DC power is supplied between said substrate and said surface layer.

13. The electron source structure according to claim 12, wherein said surface layer includes a p-type impurity density higher than that in said superlattice structure.

14. The electron source structure according to claim 13, wherein said surface layer is formed of a material having an electron affinity smaller than that of a material of said superlattice structure.

15. The electron source structure according to claim 12, wherein said strained well layer has a lattice constant different from that of said substrate such that said superlattice structure has strain of the lattice structure.

16. The electron source structure according to claim 12, wherein said strained well layer and said barrier layer have p-type impurity densities which are lower than that of said surface layer.

17. The electron source structure according to claim 16, wherein the impurity density of each of said strained well layer and said barrier layer is in a range of between $5\times10^{16}$ $cm^{-3}$ and $1\times10^{18}$ $cm^{-3}$ and the impurity density of said surface layer is in a range of between $1\times10^{19}$ $cm^{31\ 3}$ and $1\times10^{20}$ $cm^{-3}$ .

18. An electron source structure according to claim 12, wherein one of said strained well layer and said barrier layer is an intrinsic type and the other has a p-type impurity density which is lower than that of said surface layer.

19. An electron source structure according to claim 12, wherein an average of lattice constants of said first and second layers is substantially equal to a lattice constant of said substrate.

* * * * *

UNITED STATES PATENT AND TRADEMARK OFFICE

CERTIFICATE OF CORRECTION

PATENT NO. : 5,877,510

DATED : March 2, 1999

INVENTOR(S) : Baba et al

It is certified that error appears in the above-identified patent and that said Letters Patent is hereby corrected as shown below:

Claim 17, Col. 12, line 56, "$cm^{31\ 3}$" should be - -$cm^{-3}$- -.

Signed and Sealed this

Twenty-fifth Day of January, 2000

*Attest:*

*Attesting Officer*

*Acting Commissioner of Patents and Trademarks*

UNITED STATES PATENT AND TRADEMARK OFFICE

CERTIFICATE OF CORRECTION

PATENT NO. : 5,877,510

DATED : March 2, 1999

INVENTOR(S) : Baba et al

It is certified that error appears in the above-identified patent and that said Letters Patent is hereby corrected as shown below:

Claim 5, Col. 11, Line 28 insert - -substrate- - after "said".

Signed and Sealed this

Eighteenth Day of July, 2000

Attest:

Q. TODD DICKINSON

*Attesting Officer*

*Director of Patents and Trademarks*